(12) United States Patent
Chi et al.

(10) Patent No.: US 12,136,647 B2
(45) Date of Patent: Nov. 5, 2024

(54) SUPER JUNCTION POWER DEVICE AND METHOD OF MAKING THE SAME

(71) Applicant: SiEn (QingDao) Integrated Circuits Co., Ltd., Shandong (CN)

(72) Inventors: Min-Hwa Chi, Qingdao (CN); Conghui Liu, Qingdao (CN); Huan Wang, Qingdao (CN); Longkang Yang, Qingdao (CN); Richard Ru-Gin Chang, Qingdao (CN)

(73) Assignee: SiEn (QingDao) Integrated Circuits Co., Ltd., Qingdao (CN)

( * ) Notice: Subject to any disclaimer, the term of this patent is extended or adjusted under 35 U.S.C. 154(b) by 113 days.

(21) Appl. No.: 17/346,038

(22) Filed: Jun. 11, 2021

(65) Prior Publication Data
US 2021/0391419 A1    Dec. 16, 2021

(30) Foreign Application Priority Data

Jun. 12, 2020  (CN) .......................... 202010536040.3

(51) Int. Cl.
*H01L 29/06* (2006.01)
*H01L 29/66* (2006.01)
*H01L 29/78* (2006.01)

(52) U.S. Cl.
CPC .... *H01L 29/0634* (2013.01); *H01L 29/66734* (2013.01); *H01L 29/7811* (2013.01); *H01L 29/7813* (2013.01)

(58) Field of Classification Search
CPC ........... H01L 29/0634; H01L 29/66734; H01L 29/7813; H01L 29/7811; H01L 29/0873; H01L 29/1095
See application file for complete search history.

(56) References Cited

U.S. PATENT DOCUMENTS

| 2007/0052015 | A1* | 3/2007 | Miura ................. H01L 29/7811 |
| | | | 257/E29.066 |
| 2007/0114599 | A1* | 5/2007 | Hshieh ............. H01L 29/66734 |
| | | | 257/330 |

(Continued)

*Primary Examiner* — Samuel A Gebremariam
*Assistant Examiner* — Jonas T Beardsley
(74) *Attorney, Agent, or Firm* — Chen Yoshimura LLP

(57) ABSTRACT

The present invention provides a power device with super junction structure (or referred to as super junction power device) and a method of making the same. A floating island of a second conductivity type of a cell region, a floating island of the second conductivity type of a termination region, a pillar of the second conductivity type of the cell region and a pillar of the second conductivity type of the termination region may be formed through adding a super junction mask (or reticle) after forming the epitaxial layer of a first conductivity type, through a well mask (or reticle) before or after forming a well of the second conductivity type, and through a contact mask (or reticle) before or after forming a contact structure. Therefore, the process is simple, the cost is low and yield and reliability are high. A breakdown voltage (or referred to as withstand or blocking voltage) may be raised as a result of the charge sharing effect of the floating island of the second conductivity type and the pillar of the second conductivity type in the cell region and both Miller capacitance and input capacitance can be decreased. An on-state resistance can be decreased due to a higher doping level of the epitaxial layer of a first conductivity type allowed to use without degrading the breakdown voltage. A withstand (or blocking) voltage in the termination region may be raised, an area thereof may be reduced, and a whole area of a high voltage device may be decreased because of the floating island of the second conductivity type and the pillar of the second conductivity type of the termination region.

8 Claims, 10 Drawing Sheets

(56) References Cited

U.S. PATENT DOCUMENTS

| | | | | |
|---|---|---|---|---|
| 2008/0116512 A1* | 5/2008 | Kawaguchi | ....... | H01L 29/66734 |
| | | | | 257/334 |
| 2012/0007173 A1* | 1/2012 | Yamamoto | .......... | H01L 29/1095 |
| | | | | 438/270 |
| 2012/0273871 A1* | 11/2012 | Yedinak | .............. | H01L 29/7813 |
| | | | | 257/329 |
| 2016/0126346 A1* | 5/2016 | Hung | .................. | H01L 29/1095 |
| | | | | 257/77 |
| 2016/0293693 A1* | 10/2016 | Niimura | .............. | H01L 29/7813 |

* cited by examiner

Forming an epitaxial layer of a first conductivity type, comprising a cell region and a termination region surrounding the cell region.

Forming a trench gate structure of the cell region in the epitaxial layer of the first conductivity type, the trench gate structure comprising a gate oxide layer and a gate conductive layer.

Through a well mask, in the epitaxial layer of the first conductivity type, forming a plurality of wells of a second conductivity type comprising a well of the second conductivity type of the cell region and a well of the second conductivity type of the termination region.

Through a source mask, in the well of the second conductivity type of the cell region, forming a source of the first conductivity type of the cell region.

Through a contact mask, forming a plurality of contact structures comprising a contact structure in the cell region and a contact structure in the termination region, the contact structure in the cell region being passing through the source of the first conductivity type of the cell region and in mutual contact with the well of the second conductivity type of the cell region, and the contact structure in the termination region being in mutual contact with the well of the second conductivity type of the termination region.

Forming a plurality of floating islands of the second conductivity type, positioning in the epitaxial layer of the first conductivity type, and a top surface and a bottom surface of the floating island of the second conductivity type being in mutual contact with the epitaxial layer of the first conductivity type, wherein the floating islands of the second conductivity type comprise a floating island of the second conductivity type of the cell region and a floating island of the second conductivity type of the termination region.

Forming a plurality of pillars of the second conductivity type, positioning in the epitaxial layer of the first conductivity type and right above the floating island of the second conductivity type, and being in mutual contact with the well of the second conductivity type, wherein the pillars of the second conductivity type comprise a pillar of the second conductivity type of the cell region and a pillar of the second conductivity type of the termination region.

FIG. 1

SUPER JUNCTION POWER DEVICE AND METHOD OF MAKING THE SAME

FIELD OF THE INVENTION

The present invention belongs to semiconductor device technology, and relates to a super junction power device and a method of making the same.

BACKGROUND OF THE INVENTION

In the field of power device, VDMOSFET (Vertical Double Diffused Metal Oxide Semiconductor Field Effect Transistor) is widely applied because of its advantages such as high operating frequency, good thermal stability and simple driving circuit. The two most important parameters for a power device among all are the breakdown voltage (BV) and on-resistance (Ron). A popular design of a power device on these two parameters is to provide high enough BV and low Ron as well to decrease power consumption.

Improvement of performance of a traditional power device was held back because of the tradeoff of BV and Ron on each other. Therefore, a super junction was introduced into a drift region of a traditional VDMOSFET to form a super junction structure in power MOSFET (referred to as SJMOS) to optimize the relation between BV and Ron to show advantages such as low Ron, fast turning on and low switching consumption.

Current method of a super junction structure is generally formed by a deep trench etching process and a filling process in an epitaxial layer or formed by multiple steps of an epitaxial process and an implantation of doping in the epitaxial layer so as to increase BV due to charge sharing effect. Then, the doping concentration of the epitaxial layer may be allowed significantly higher to achieve lower Ron at on-state; the equivalent doping concentration in epi layer at off-state can be lower (due to the charge sharing effect) to achieve same or higher BV. However, when the super junction is formed with the deep trench etching and filling process in the epitaxial layer, the deep trench may result in mechanical stress, poor defects and uniformity problems, and in turn degrading yield and reliability. The deeper the deep trench leads to larger aspect ratio of trench and more difficulty in filling back and implant dose with accuracy (for precision charge sharing) to achieve a higher BV. Additionally, the formation process is complicate and higher cost when the super junction is formed by performing multiple steps of epitaxial growth and selective (i.e. patterned) implant of doping in the epitaxial layer.

The power device may be formed with a cell region and a termination region. The cell region is primarily used for conduction of the chip and the termination region is used for surrounding the whole cell region as a voltage withstand structure at off-state. A voltage withstand structure which is big enough is required because usually the voltage withstand capability is worse in the termination region. The better the voltage withstand structure is, the less the area of the termination structure is. As such, the effect of the voltage withstand structure affects the whole area of the high voltage device.

Current termination structures mainly comprise field plate (FP), junction termination extension (JTE), floating guard ring (FGR), deep trench (DT), deep trench ring, etc. These termination structures are usually with greater width, and additional mask(s) or material(s) is needed so as to increase the complexity of the forming process, as well as the cost.

Therefore, it is needed to provide a better super junction power device and method of making the same.

SUMMARY OF THE INVENTION

In light of above-mentioned drawbacks of the current technology, an object of the present invention is to provide a super junction power device and a method of making the same to solve the problems of stress, defect and uniformity and the problems of complicate processes, higher cost, low efficiency of a conventional termination voltage withstand structure, greater area for a termination, and affecting the whole area of a high voltage device.

To implement above-mentioned object and other related objects, the present invention provides a method of making a super junction power device, comprising steps of:

forming an epitaxial layer of a first conductivity type, comprising a cell region and a termination region surrounding the cell region;

forming a trench gate structure of the cell region in the epitaxial layer of the first conductivity type, the trench gate structure of the cell region comprising a gate oxide layer and a gate conductive layer;

through a well mask, in the epitaxial layer of the first conductivity type, forming a plurality of wells of a second conductivity type comprising a well of the second conductivity type of the cell region and a well of the second conductivity type of the termination region;

through a source mask, in the well of the second conductivity type of the cell region, forming a source of the first conductivity type of the cell region;

through a contact mask, forming a plurality of contact structures comprising a contact structure in the cell region and a contact structure in the termination region, the contact structure in the cell region being passing through the source of the first conductivity type of the cell region and in mutual contact with the well of the second conductivity type of the cell region, and the contact structure in the termination region being in mutual contact with the well of the second conductivity type of the termination region;

forming a floating island of the second conductivity type, positioning in the epitaxial layer of the first conductivity type, and a top surface and a bottom surface of the floating island of the second conductivity type being in mutual contact with the epitaxial layer of the first conductivity type, wherein the floating islands of the second conductivity type comprise a floating island of the second conductivity type of the cell region and a floating island of the second conductivity type of the termination region;

forming a pillar of the second conductivity type, positioning in the epitaxial layer of the first conductivity type and right above the floating island of the second conductivity type, and being in mutual contact with the well of the second conductivity type, wherein the pillars of the second conductivity type comprise a pillar of the second conductivity type of the cell region and a pillar of the second conductivity type of the termination region.

Optionally, a super junction mask is used for implanting the doping dopant of the second conductivity type into the epitaxial layer of the first conductivity type to form the floating island of the second conductivity type and the pillar of the second conductivity type successively.

Optionally, before or after forming the well of the second conductivity type, through the well mask, dopant of the second conductivity type is implanted into the epitaxial layer of the first conductivity type to form the floating island of the second conductivity type and the pillar of the second conductivity type successively.

Optionally, before or after forming the contact structure, through the contact mask, dopant of the second conductivity type is implanted into the epitaxial layer of the first conductivity type to form the floating island of the second conductivity type and the pillar of the second conductivity type successively.

Optionally, a thickness range of the epitaxial layer of the first conductivity type between the formed floating island of the formed second conductivity type and the pillar of the second conductivity type is greater than 0.1 μm.

Optionally, the first conductivity type is n type, and the second conductivity type is p type; or the first conductivity type is p type, and the second conductivity type is n type.

Optionally, the method may further comprise a step of, through the source mask, in the well of the second conductivity type of the termination region, forming a source of the first conductivity type of the termination region, and the contact structure in the termination region being passing through the source of the first conductivity type of the termination region.

Optionally, the step of forming the contact structures may comprise:
- through the contact mask, forming a contact trench of the cell region passing through the source of the first conductivity type of the cell region and a contact trench of the termination region passing through the source of the first conductivity type of the termination region;
- through the contact mask, forming a contact of the second conductivity type of the cell region and a contact of the second conductivity type of the termination region;
- through the contact mask, forming a metal contact of the cell region filling in the contact trench of the cell region and a metal contact of the termination region filling in the contact trench of the termination region.

Optionally, the method may further comprise at least one step of forming the termination region in a field plate and a field limiting ring.

Optionally, the method may further comprise a step of forming a buffer layer of the first conductivity type at the bottom surface of the epitaxial layer of the first conductivity type.

Optionally, the method may further comprise a step of forming an implanted layer of the second conductivity type at the bottom surface of the epitaxial layer of the first conductivity type.

The present invention further provides a super junction power device, characterized by, the super junction power device comprising:
- an epitaxial layer of a first conductivity type, comprising a cell region and a termination region surrounding the cell region;
- a plurality of wells of a second conductivity type, positioning in the epitaxial layer of the first conductivity type, comprising a well of the second conductivity type of the cell region and a well of the second conductivity type of the termination region;
- a source of the first conductivity type of the cell region, positioning in the well of the second conductivity type;
- a trench gate structure of the cell region, comprising a gate oxide layer and a gate conductive layer, positioned in the epitaxial layer of the first conductivity type and passing through the source of the first conductivity type of the cell region and the well of the second conductivity type of the cell region;
- a plurality of contact structure, comprising a contact structure in the cell region and a contact structure in the termination region, the contact structure in the cell region being passing through the source of the first conductivity type of the cell region and in mutual contact with the well of the second conductivity type of the cell region, the contact structure in the termination region being in mutual contact with the well of the second conductivity type of the termination region;
- a floating island of the second conductivity type, positioning in the epitaxial layer of the first conductivity type, and a top surface and a bottom surface of the floating island of the second conductivity type being in mutual contact with the epitaxial layer of the first conductivity type, wherein the floating islands of the second conductivity type comprise a floating island of the second conductivity type of the cell region and a floating island of the second conductivity type of the termination region;
- a pillar of the second conductivity type, positioning in the epitaxial layer of the first conductivity type and right above the floating island of the second conductivity type, and being in mutual contact with the well of the second conductivity type, wherein the pillars of the second conductivity type comprise a pillar of the second conductivity type of the cell region and a pillar of the second conductivity type of the termination region.

Optionally, a width of the floating island of the second conductivity type of the cell region is the same as that of the pillar of the second conductivity type of the cell region, and a width of the floating island of the second conductivity type of the termination region is the same as that of the pillar of the second conductivity type of the termination region.

Optionally, a thickness range of the epitaxial layer of the first conductivity type between the floating island of the second conductivity type and the pillar of the second conductivity type is greater than 0.1 μm.

Optionally, the first conductivity type is n type, and the second conductivity type is p type; or the first conductivity type is p type, and the second conductivity type is n type.

Optionally, the super junction power device may further comprise a source of the first conductivity type of the termination region, positioned in the well of the second conductivity type of the termination region, and the contact structure in the termination region being passing through the source of the first conductivity type of the termination region.

Optionally, the super junction power device may further comprise at least one of a field plate and a field limiting ring in the termination region.

Optionally, the super junction power device may further comprise a buffer layer of the first conductivity type at the bottom surface of the epitaxial layer of the first conductivity type.

Optionally, the super junction power device may further comprise an implanted layer of the second conductivity type at the bottom surface of the epitaxial layer of the first conductivity type.

As mentioned above, the super junction power device and the method of making the same of the present invention produce effects of:

When making the super junction power device, dopant of a second conductivity type may be implanted into the epitaxial layer of the first conductivity type to form floating islands of the second conductivity type and pillars of the second conductivity type successively through adding the super junction mask after forming the epitaxial layer of the first conductivity type, directly through the well mask before or after forming the well of the second conductivity type, and directly through the contact mask before or after forming the contact structure. The floating islands of the second conductivity type comprise the floating island of the second conductivity type of the cell region and the floating island of the second conductivity type of the termination region, and the pillars of the second conductivity type comprise the pillar of the second conductivity type of the cell region and the pillar of the second conductivity type of the termination region. The conventional method by using multiple epitaxial growth and deep trench etching process may not be effective, the new method to form super junction structure is simple, the cost is low and the yield and reliability can be high.

Because of the floating islands of the second conductivity type of the cell region and the pillars of the second conductivity type of the cell region, in open state (or off-state), a breakdown voltage may be raised and both Miller capacitance and input capacitance may be decreased because both the floating islands of the second conductivity type and the pillars of the second conductivity type facilitate the charge sharing effect in a drift region of the epitaxial layer of the first conductivity type. An drift region in the epitaxial layer of the first conductivity type is allowed to have higher doping concentration for significantly more conducting current and decreasing an on-state resistance of a VDMOSFET device. Further, because of the epitaxial layer of the first conductivity type between the floating island of the second conductivity type of the cell region and the pillar of the second conductivity type of the cell region, an additional triode (i.e. bipolar transistor) may be formed in the epitaxial layer of the first conductivity type to further decrease the on-state resistance of a IGBT device. Meanwhile, both the floating islands of the second conductivity type of the termination region and the pillars of the second conductivity type of the termination region can be served as a voltage divider to raise the efficiency of the termination voltage withstand structure and reduce required area of the termination to reduce the whole area of the high voltage device.

BRIEF DESCRIPTION OF THE DRAWINGS

FIG. 1 shows a process flow chart of forming a super junction power device according to the present invention.

| Reference Signs | |
|---|---|
| 101, 201, 301 | a substrate of a first conductivity type |
| 102, 202, 302 | an epitaxial layer of the first conductivity type |
| 1031, 2031, 3031 | a well of a second conductivity type of the cell region |
| 1032, 2032, 3032 | a well of a second conductivity type of the termination region |
| 1041, 2041, 3041 | a source of the first conductivity type of the cell region |
| 1042, 2042, 3042 | a source of the first conductivity type of the termination region |
| 1051, 2051, 3051 | a contact structure of the cell region |
| 1052, 2052, 3052 | a contact structure of the termination region |
| 3051a, 3052a | a contact of the second conductivity type |
| 3051b, 3052b | a metal contact |
| 1061, 2061, 3061 | a floating island of the second conductivity type of the cell region |
| 1062, 2062, 3062 | a floating island of the second conductivity type of the termination region |
| 1071, 2071, 3071 | a pillar of the second conductivity type of the cell region |
| 1072, 2072, 3072 | a pillar of the second conductivity type of the termination region |
| 1081, 2081, 3081 | a gate oxide layer |
| 109, 209, 309 | a gate conductive layer |
| 110, 210, 310 | a field plate |
| 120, 220, 320 | an implanted layer of the second conductivity type |
| 330 | a buffer layer of the first conductivity type |
| A | a cell region |
| B | a termination region |

DESCRIPTION OF EMBODIMENTS OF THE INVENTION

Reference is now made to the following concrete examples taken in conjunction with the accompanying drawings to illustrate implementation of the present invention. Persons of ordinary skill in the art having the benefit of the present disclosure will understand other advantages and effects of the present invention. The present invention may be implemented with other examples. For various view or application, details in the present disclosure may be used for variation or change for implementing embodiments within the scope of the present invention.

Please refer to FIGS. 1 to 13. Please note that the drawings provided here are only for examples but not limited to the specific number or scale shown therein. When implementing the examples according to the drawings, condition, number and proportion of each element may be changed and arrangement of the elements may be in a more complex way.

Please refer to FIG. 1 for making a super junction power device, in which the steps of forming a floating island of a second conductivity type and a pillar of the second conductivity type may be optional, depending on actual needs, and embodiments may be illustrated below.

First Embodiment

Figure 2:
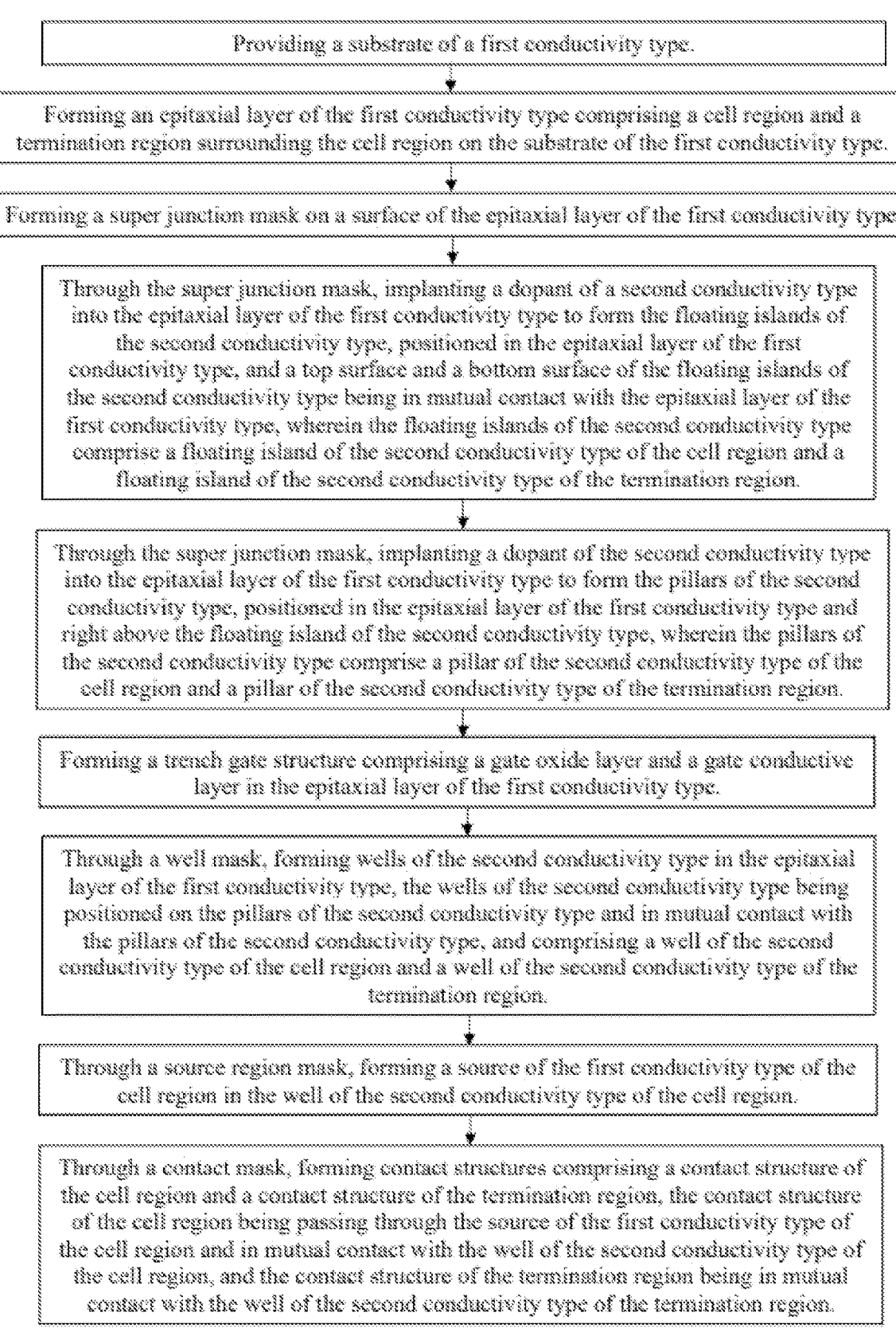
FIG. 2 shows a process flow chart of forming a super junction power device according to a first embodiment.

Please refer to FIG. 2 which shows a process flow chart of making a super junction power device having both the floating island of the second conductivity type of the cell region and the pillar of the second conductivity type of the cell region in the cell region and both the floating island of the second conductivity type of the termination region and the pillar of the second conductivity type of the termination region in the termination region according to the present embodiment. Please also refer to FIGS. 3-5 for perspective views of a structure of the formed super junction power device.

In the present embodiment, dopant of a second conductivity type may be implanted directly into an epitaxial layer of a first conductivity type to form the floating island of the second conductivity type of the cell region and the pillar of the second conductivity type of the cell region with the same width successively in the cell region and the floating island of the second conductivity type of the termination region and the pillar of the second conductivity type of the termination region with the same width successively in the termination region through adding a super junction mask after forming an epitaxial layer of the first conductivity type. Therefore, the new process for forming super junction structure is simple, the cost is low, and the yield and reliability are high. Further, a withstand voltage in the termination region may be raised, an area thereof may be reduced, and a whole area of a high voltage device may be decreased.

Please note that in the present embodiment the first conductivity type is n type, and the second conductivity type is p type, and in another embodiment the first conductivity type may be p type, and the second conductivity type may be n type. No more limitation is needed here.

According to FIG. 2, the formation process comprises steps of:
providing a substrate of a first conductivity type 101;
forming an epitaxial layer of the first conductivity type 102 on the substrate of the first conductivity type 101, the epitaxial layer of the first conductivity type 102 comprising the cell region A and the termination region B, and the termination region B being surrounding the periphery of the cell region A;
forming a super junction mask on the surface of the epitaxial layer of the first conductivity type 102;
through the super junction mask, implanting a dopant of a second conductivity type in the epitaxial layer of the first conductivity type 102 to form the floating islands of the second conductivity type 106, positioned in the epitaxial layer of the first conductivity type 102, and a top surface and a bottom surface of the floating islands of the second conductivity type 106 being in mutual contact with the epitaxial layer of the first conductivity type 102, wherein the floating islands of the second conductivity type comprise the floating islands of the second conductivity type of the cell region 1061 and the floating islands of the second conductivity type of the termination region 1062;
through the super junction mask, implanting a dopant of the second conductivity type in the epitaxial layer of the first conductivity type 102 to form the pillars of the second conductivity type, positioned in the epitaxial layer of the first conductivity type 102 and right above the floating island of the second conductivity type, wherein the pillars of the second conductivity type comprise the pillars of the second conductivity type of the cell region 1071 and the pillars of the second conductivity type of the terminal region 1072;
forming a trench gate structure of the cell region in the epitaxial layer of the first conductivity type 102, the trench gate structure of the cell region comprising a gate oxide layer 1081 and a gate conductive layer 109;
through a well mask, forming wells of a second conductivity type in the epitaxial layer of the first conductivity type 102, the wells of the second conductivity type being positioned on the pillars of the second conductivity type and in mutual contact with the pillar of the second conductivity type, and comprising a well of the second conductivity type of the cell region 1031 and a well of the second conductivity type of the termination region 1032;
through a source mask, forming a source of the first conductivity type of the cell region 1041 in the well of the second conductivity type of the cell region 1031;
through a contact mask, forming contact structures comprising a contact structure of the cell region 1051 and a contact structure of the termination region 1052, the contact structure of the cell region 1051 being passing through the source of the first conductivity type of the cell region 1041 and in mutual contact with the well of the second conductivity type of the cell region 1031, and the contact structure of the termination region 1052 being in mutual contact with the well of the second conductivity type of the termination region 1032.

Specifically, at first, the substrate of the first conductivity type 101 is provided. The material of the substrate of the first conductivity type 101 may be doped semiconductor materials such as silicon (Si), silicon-germanium (SiGe), gallium nitride (GaN) or silicon carbide (SiC).

Then, on the substrate of the first conductivity type 101, the epitaxial layer of the first conductivity type 102 is formed through epitaxial (epi) growth, the epitaxial layer of the first conductivity type 102 comprises the cell region A and the termination region B, and the termination region B is surrounding the periphery of the cell region A.

Then, the super junction mask is formed on the epitaxial layer of the first conductivity type 102.

Specifically, on a surface of the epitaxial layer of the first conductivity type 102, a layer of hard mask material may be deposited. The deposition may be performed with but not limited to chemical vapor deposition. The layer of hard mask material may be and not limited to a layer of silicon dioxide. Then, on a surface of the layer of hard mask material, both the floating islands of the second conductivity type and the pillars of the second conductivity type may be formed through a lithography process, a dry etching process dry-etching the layer of hard mask material with a photoresist layer as etching mask that forms the super junction mask having the floating islands of the second conductivity type and the pillars of the second conductivity type.

Then, through the super junction mask, dopant of the second conductivity type is implanted into the epitaxial layer of the first conductivity type 102 to form the floating islands of the second conductivity type, comprising the floating islands of the second conductivity type of the cell region 1061 and the floating islands of the second conductivity type of the termination region 1062. Then, through the floating island of the second conductivity type of the cell region 1061, when the power device is in open state (or off-state), the charge sharing effect of the drift region of the epitaxial layer of the first conductivity type 102 can result in effectively reduced doping level, so as to raise the breakdown voltage and decrease both Miller capacitance and input capacitance of the power device. The floating island of the second conductivity type of the cell region 1061 allows the drift region of the epitaxial layer of the first conductivity type having higher doping concentration, so that the on-state resistance of the device can be lower. Meanwhile, the floating islands of the second conductivity type of the termination region 1062 can be served as a voltage divider to raise the efficiency of the termination voltage withstand structure and reduce required area of the termination to decrease the whole area of the high voltage device.

Then, through the super junction mask, dopant of the second conductivity type is implanted in to the epitaxial layer of the first conductivity type 102 to form the pillars of the second conductivity type comprising the pillar of the second conductivity type of the cell region 1071 and the pillar of the second conductivity type of the termination region 1072. Through the pillar of the second conductivity type of the cell region 1071, when the power device is in open state (or off-state), the charge sharing effect of the drift region of the epitaxial layer of the first conductivity type 102 can result in effectively reduced doping level, so as to raise the breakdown voltage and decrease both Miller capacitance and input capacitance of the power device. The pillar of the second conductivity type of the cell region 1071 allows the drift region of the epitaxial layer of the first conductivity type having higher doping concentration, so that the on-state resistance of the device can be lower. Meanwhile, the pillar of the second conductivity type of the termination region 1072 can be served as a voltage divider to raise the efficiency of the termination voltage withstand structure and reduce required area of the termination to decrease the whole area of the high voltage device.

The sequence to form the floating islands of the second conductivity type and the pillars of the second conductivity type may be inter-changeable. The doping concentration of the floating islands of the second conductivity type and the pillars of the second conductivity type may be the same. The dopant may not be limited to B11. Because the floating islands of the second conductivity type and the pillars of the second conductivity type are formed with the same super junction mask in the present embodiment, the floating island of the second conductivity type of the cell region 1061 and the pillar of the second conductivity type of the cell region 1071 have the same width, and the floating island of the second conductivity type of the termination region 1062 and the pillar of the second conductivity type of the termination region 1072 have the same as well.

In an example, a thickness range of the epitaxial layer of the first conductivity type 102 between the formed floating islands of the formed second conductivity type and the pillars of the second conductivity type is greater than 0.1 μm. A pnp triode (i.e. parasitic bipolar transistor) is formed between the formed floating islands of the formed second conductivity type and the pillars of the second conductivity type; this parasitic pnp bipolar structure may further reduce the on-state resistance of an IGBT device.

Then, in the epitaxial layer of the first conductivity type 102, forming a trench gate structure of the cell region;

Specifically, the trench gate structure of the cell region may facilitate reducing unit area of the power device, in which the step of forming the trench gate structure of the cell region may comprise:

forming the trench gate structure of the cell region with etching the epitaxial layer of the first conductivity type 102;

growing a layer of gate oxide layer 1081 covering a bottom and a sidewall of the trench gate structure of the cell region on a surface of the trench gate structure of the cell region with applying a thermal oxidation growth process;

forming a gate conductive layer 109 with depositing polysilicon in the trench gate structure of the cell region;

wherein through the trench gate structure of the cell region, the unit area of the power device may be reduced. The process to form the trench gate structure of the cell region and the structure of the trench gate structure may not be limited to what is disclosed here, for example, the structure may be varied to be a split gate.

Then, through the well mask, the wells of the second conductivity type were formed in the epitaxial layer of the first conductivity type 102. The wells of the second conductivity type were positioned on the pillars of the second conductivity type and in mutual contact with the pillars of the second conductivity type. The wells of the second conductivity type comprise the well of the second conductivity type of the cell region 1031 and the well of the second conductivity type of the termination region 1032.

Then, through the source mask, the source of the first conductivity type of the cell region 1041 is formed in the well of the second conductivity type of the cell region 1031.

Then, through the contact mask, the contact structures comprising the contact structure of the cell region 1051 and the contact structure of the termination region 1052 are formed. The contact structure of the cell region 1051 is passing through the source of the first conductivity type of the cell region 1041 and in mutual contact with the well of the second conductivity type of the cell region 1031, and the contact structure of the termination region 1052 is in mutual contact with the well of the second conductivity type of the termination region 1032.

For example, when forming the source of the first conductivity type of the cell region 1041, a more step of forming the source of the first conductivity type of the termination region 1042 in the well of the second conductivity type of the termination region 1032 through the source mask may be further performed.

Figure 3:
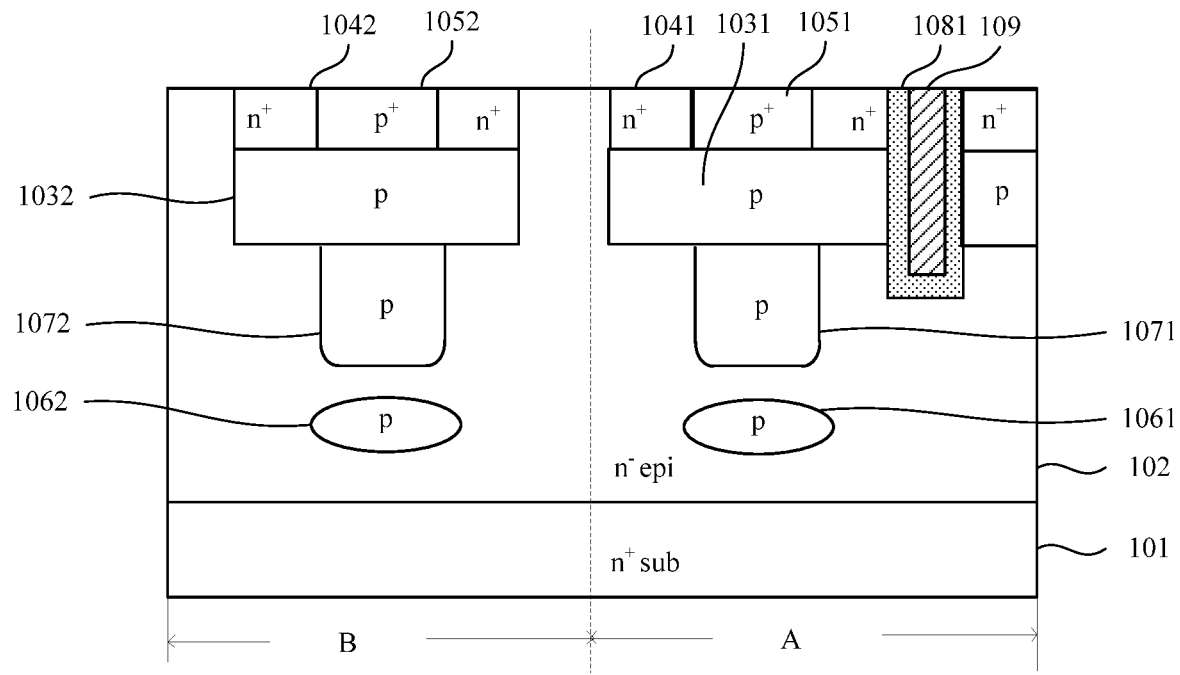
FIG. 3 shows a perspective view of a structure of a super junction power device according to the first embodiment.

Specifically, as shown in FIG. 3, in the present embodiment, the contact structures are formed with implanting the dopant of the second conductivity type in the wells of the second conductivity type to form the short-circuit connection to the sources of the first conductivity type that further reduces the on-state resistance. The contact structures comprise the contact structure of the cell region 1051 and the contact structure of the termination region 1052. The contact structure of the cell region 1051 is in short-circuit connection to the source of the first conductivity type of the cell region 1041 and in mutual contact with the well of the second conductivity type of the cell region 1031. The contact structure of the termination region 1052 is but not limited to passing through the source of the first conductivity type of the termination region 1042 and in mutual contact with the well of the second conductivity type of the termination region 1032. The contact structure may be varied, it may comprise a contact of the second conductivity type in the well of the second conductivity type and a metal contact in mutual contact with the contact of the second conductivity type, for example, the metal contact may be metal W to further lower an on-state resistance and reduce area for a conventional planar contact structure. The details of the trench gate structure will be introduced in the following embodiment.

Then, more steps of forming a source metal layer and a drain metal layer may be comprised to form a VDMOSFET device, in which the gate structure is known as planar type. The steps to form the super junction power device may be varied depending on the needs. Further, the structure of the gate may be a trench gate or a split gate.

For example, one more step of forming a field plate 110 and a field limiting ring in the termination region B may be performed.

Figure 4:
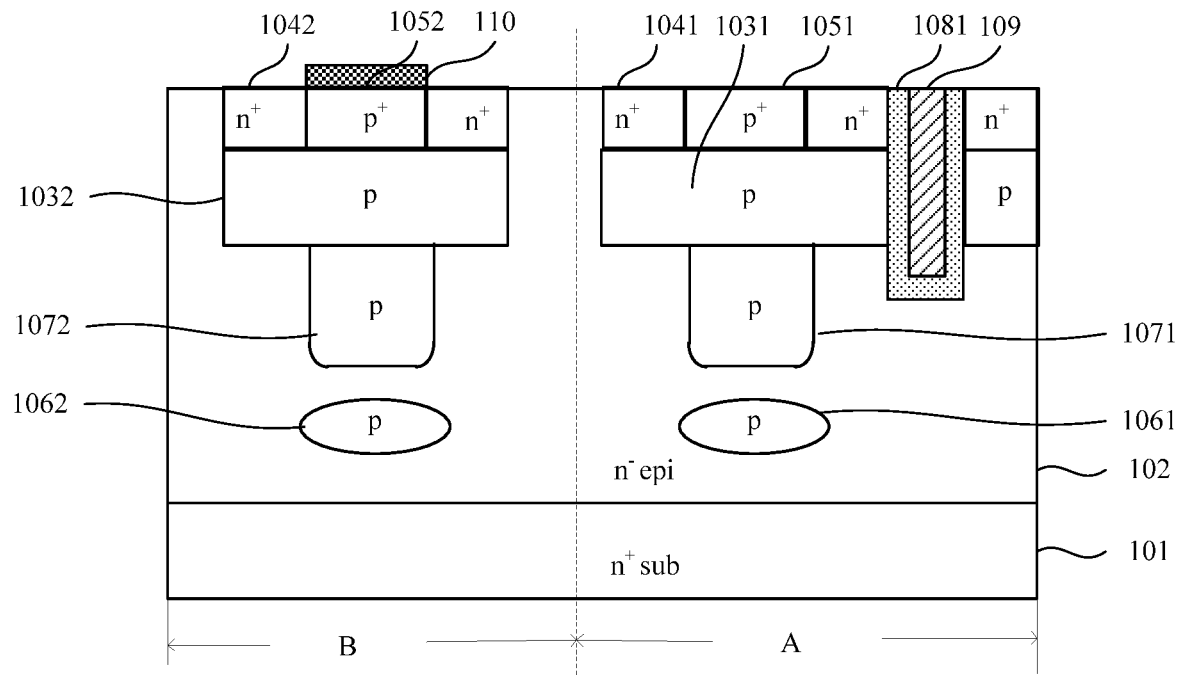
FIG. 4 shows a perspective view of a structure of a super junction VDMOSFET device according to the first embodiment.

Specifically, referring to FIG. 4, in the present embodiment, the termination region B comprises the field plate 110. The field plate 110 may be but not limited to biasing field plate. The termination region B may comprise other structure(s) such as a floating field plate, the field limiting ring, etc. to raise the withstand voltage in the termination region, reduce the area thereof and decrease the whole area of the high voltage device.

For example, one more step of forming a buffer layer of the first conductivity type at the bottom surface of the epitaxial layer of the first conductivity type 102 may be comprised.

Specifically, the doping concentration of the buffer layer of the first conductivity type may be between that of the substrate of the first conductivity type 101 and the epitaxial layer of the first conductivity type 102 for achieving high BV; so as to avoid from the dopant atoms redistribution by a high temperature process. Therefore, the breakdown voltage of the super junction power device due to doping profile redistribution in the epitaxial layer of the first conductivity type 102 may be prevented, and the problem of tail current during the devices witching off may also be solved with the substrate of the first conductivity type 101.

Figure 5:
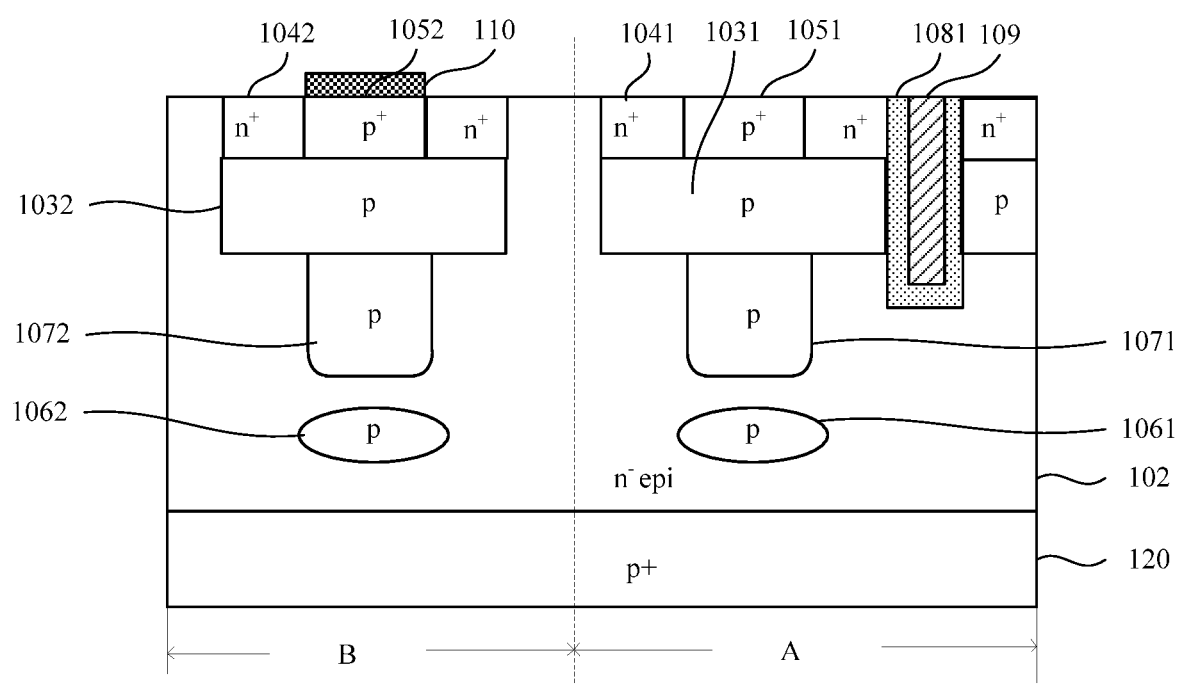
FIG. 5 shows a perspective view of a structure of a super junction IGBT device according to the first embodiment.

Please refer to FIG. 5. The present embodiment also provides a method of making an IGBT device. The difference between the method of making a VDMOSFET device in FIG. 4 and the method of FIG. 5 is an additional implanted layer of the second conductivity type 113 2. Specifically, the substrate of the first conductivity type 101 may be removed with the backside grinding or CMP and the implanted layer of the second conductivity type 120 may be formed with but not limited to implanting the dopant of the second conductivity type.

Please refer to FIG. 3. The present embodiment also provides a super junction power device, which may be made with but not limited to one of the aforesaid methods.

Specifically, the super junction power device may comprise the epitaxial layer of the first conductivity type 102, the trench gate structure of the cell region, the wells of the second conductivity type, the sources of the first conductivity type, the contact structures, the floating islands of the second conductivity type and the pillars of the second conductivity type, in which the epitaxial layer of the first conductivity type 102 comprise the cell region A and the termination region B surrounding the periphery of the cell region A. The wells of the second conductivity type are positioned in the epitaxial layer of the first conductivity type 102. The wells of the second conductivity type comprise the well of the second conductivity type of the cell region 1031 and the well of the second conductivity type of the termination region 1032. The source of the first conductivity type of the cell region 1041 is positioned in the well of the second conductivity type of the cell region 1031. The trench gate structure is positioned in the epitaxial layer of the first conductivity type 102, comprising a gate oxide layer 1081 and a gate conductive layer 109, and passing through the source of the first conductivity type of the cell region 1041 and the well of the second conductivity type of the cell region 1031. The contact structures comprise the contact structure of the cell region 1051 and the contact structure of the termination region 1052. The contact structure of the cell region 1051 is passing through the source of the first conductivity type of the cell region 1041 and in mutual contact with the well of the second conductivity type of the cell region 1031. The contact structure of the termination cell region 1052 is in mutual contact with the well of the second conductivity type of the termination region 1032. The floating islands of the second conductivity type are positioned in the epitaxial layer of the first conductivity type 102 and the top surface and the bottom surface of the floating islands of the second conductivity type are in mutual contact with the epitaxial layer of the first conductivity type 102. The floating islands of the second conductivity type comprise the floating island of the second conductivity type of the cell region 1061 and the floating island of the second conductivity type of the termination region 1062. The pillars of the second conductivity type are positioned in the epitaxial layer of the first conductivity type 102 and right above the floating islands of the second conductivity type and in mutual contact with the wells of the second conductivity type. The pillars of the second conductivity type comprise the pillar of the second conductivity type of the cell region 1071 and the pillar of the second conductivity type of the termination region 1072.

For example, the floating island of the second conductivity type of the cell region 1061 has the same width as that of the pillar of the second conductivity type of the cell region 1071, and the floating island of the second conductivity type of the termination region 1062 has the same width as that of the pillar of the second conductivity type of the termination region 1072.

Because the super junction power device of the present invention has both the floating island of the second conductivity type of the cell region 1061 and the pillar of the second conductivity type of the cell region 1071 in the cell region A, in open state (off state), the charge sharing effect in the drift region of the epitaxial layer of the first conductivity type 102 may be facilitated, so as to raise the breakdown voltage of the device and decrease both Miller capacitance and input capacitance. Both the floating island of the second conductivity type of the cell region 1061 and the pillar of the second conductivity type of the cell region 1071 allow the drift region of the epitaxial layer of the first conductivity type 102 having higher doping concentration to significantly increase the current conduction and decrease an on-state resistance. The additional parasitic pnp bipolar structure in the epitaxial layer of the first conductivity type 102 between the floating island of the second conductivity type of the cell region 1061 and the pillar of the second conductivity type of the cell region 1071 can further decrease the on-state resistance of a IGBT device. Meanwhile, both the floating island of the second conductivity type of the termination region 1062 and the pillar of the second conductivity type of the termination region 1072 in the termination region B can be served as a voltage divider to raise the efficiency of the termination voltage withstand structure and reduce required area of the termination to decrease the whole area of the high voltage device.

For example, a thickness range of the epitaxial layer of the first conductivity type 102 between the floating islands of the second conductivity type and the pillars of the second conductivity type is greater than 0.1 µm, such as 1 µm, 5 µm.

For example, the source of the first conductivity type of the termination region 1042 may be further comprised. The source of the first conductivity type of the termination region 1042 is positioned in the well of the second conductivity type of the termination region 1032, and passing through the contact structure of the termination region 1052.

For example, one more step of forming the termination region B comprising the field plate 110 and the field limiting ring may be performed.

Specifically, referring to FIG. 4, in the present embodiment, the termination region B comprises the field plate 110. The field plate 110 may be but not limited to biasing field plate. The termination region B may comprise other structure(s) such as a floating field plate, the field limiting ring, etc. to raise the withstand voltage in the termination region, reduce the area thereof and decrease the whole area of the high voltage device.

For example, a buffer layer of the first conductivity type may be formed at the bottom surface of the epitaxial layer of the first conductivity type 102 to prevent from the re-distribution of dopant atoms of the substrate of the first conductivity type 101 diffusing into the epitaxial layer of the first conductivity type 102 in a high temperature process through the buffer layer of the first conductivity type. The buffer layer helps to prevent from the degradation of breakdown voltage of the super junction power device, and also solve the problem of tail current during device switching off.

For example, an implanted layer of the second conductivity type 120 may be formed at the bottom surface of the epitaxial layer of the first conductivity type 102.

Specifically, the VDMOSFET may be formed further with the source metal layer and the drain metal layer. Please refer to FIG. 5, which shows that an additional implanted layer of the second conductivity type 120 may be added to form an IGBT device. Further, the structure of the gate may not be limited to planar type, but also a trench type, or split gate.

Second Embodiment

Figure 6:
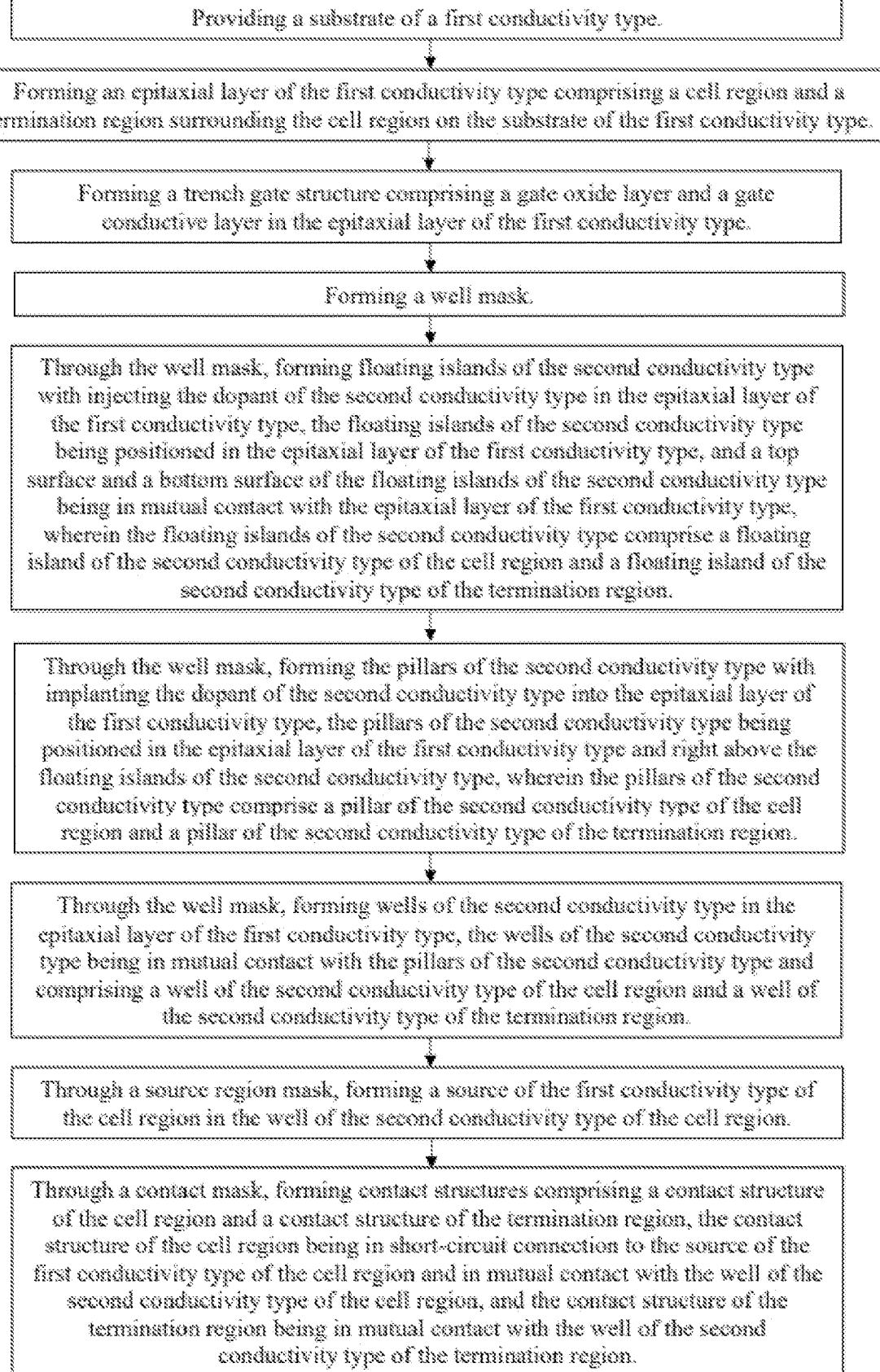
FIG. 6 shows a process flow chart of forming a super junction power device according to a second embodiment.
Figure 7:
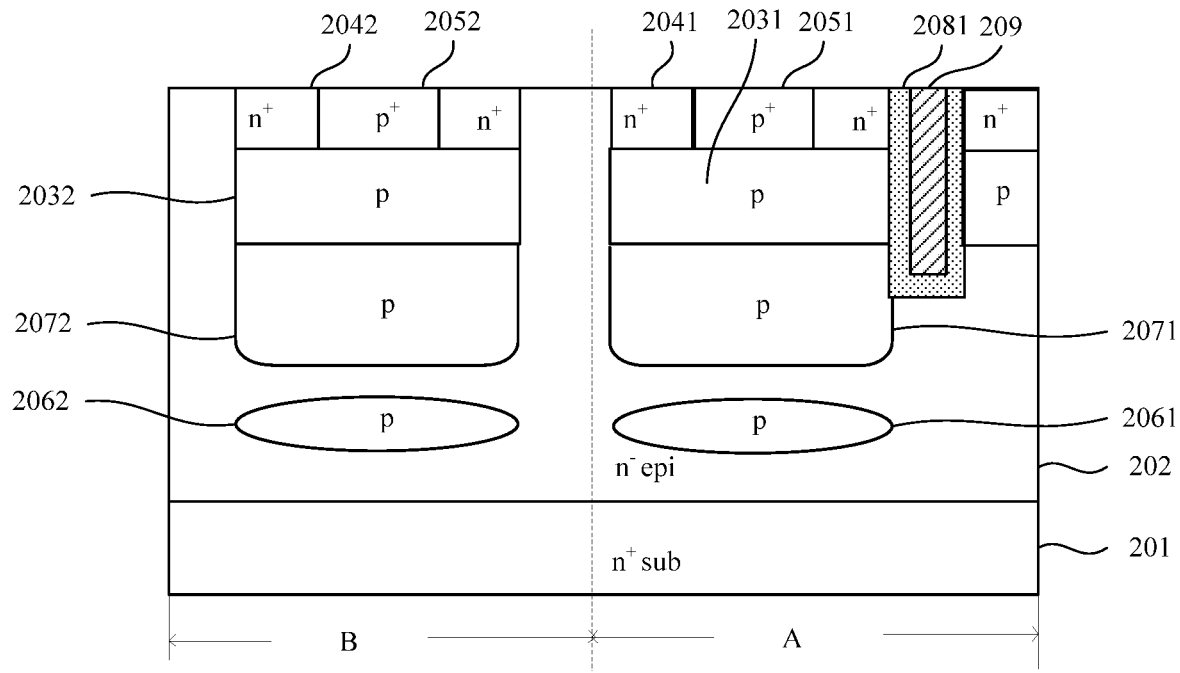
FIG. 7 shows a perspective view of a structure of a super junction power device according to a second embodiment.
Figure 8:
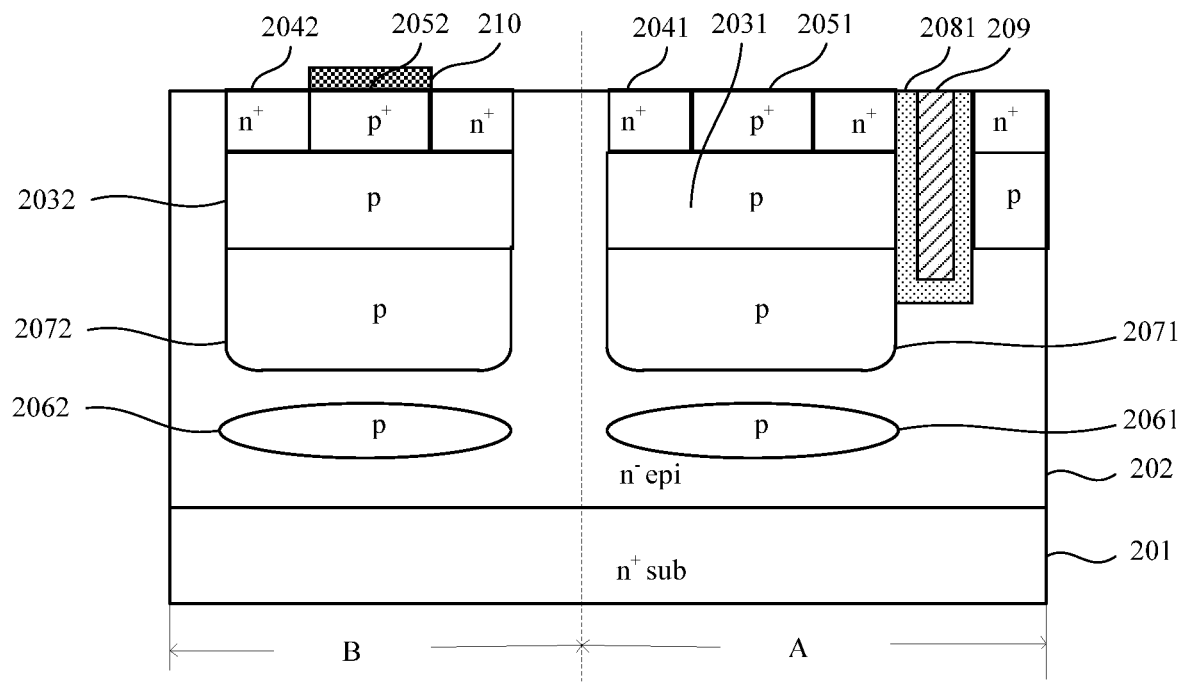
FIG. 8 shows a perspective view of a structure of a super junction VDMOSFET device according to the second embodiment.
Figure 9:
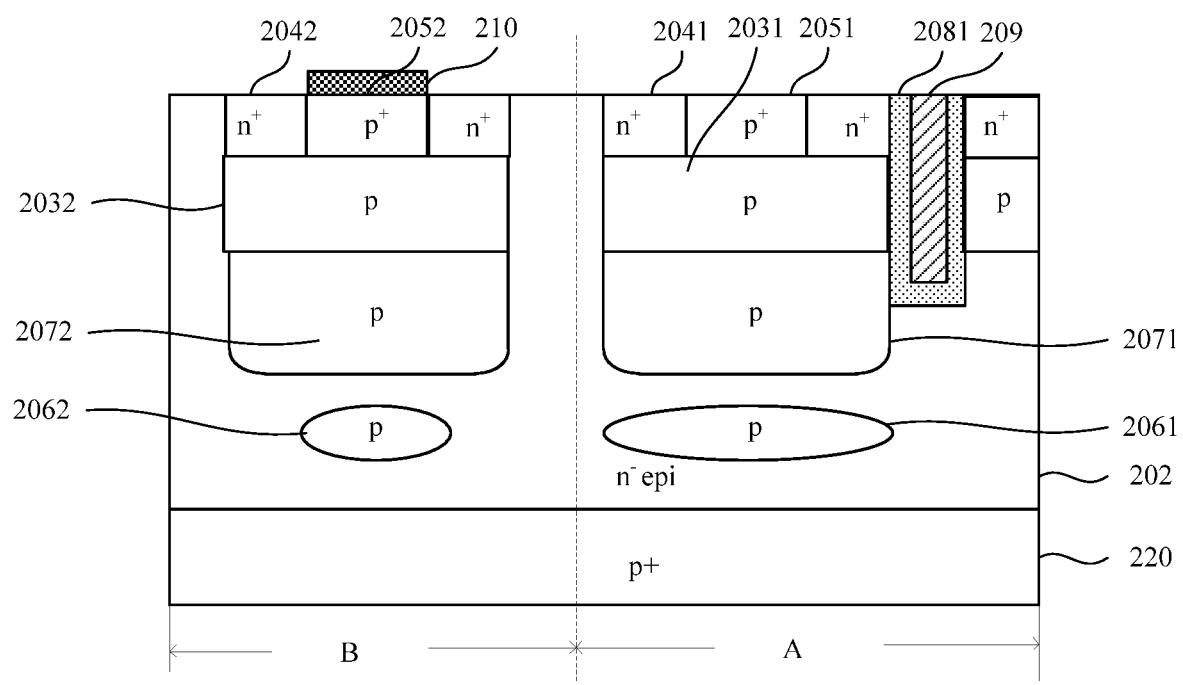
FIG. 9 shows a perspective view of a structure of a super junction IGBT device according to the second embodiment.

Please refer to FIG. 6. The present embodiment also provides a method of making another super junction power device, which has both floating islands of a second conductivity type and pillars of the second conductivity type. FIGS. 7-9 show perspective views of a structure of the super junction power device. The difference between the first and second embodiments is that, in the present embodiment, dopant of the second conductivity type may be implanted to an epitaxial layer of a first conductivity type through a well mask before or after forming a well of the second conductivity type to form a floating island of the second conductivity type of a cell region and a pillar of the second conductivity type of the cell region which has the same width as that of a well of the second conductivity type of the cell region and a floating island of the second conductivity type of a termination region and a pillar of the second conductivity type of the termination region which has the same width as that of a well of the second conductivity type of the termination region successively.

In the present embodiment, directly through the well mask, the dopant of the second conductivity type may be implanted into the epitaxial layer of the first conductivity type to sequentially form the floating island of the second conductivity type of the cell region and the pillar of the second conductivity type of the cell region in the cell region, both of which have the same width, and the floating island of the second conductivity type of the termination region and the pillar of the second conductivity type of the termination region in the termination region, both of which have the same width. No additional mask is needed either. Therefore, the formation process is simple, the cost is low and yield and reliability are high. Further, a withstand voltage in the termination region may be raised, an area thereof may be reduced, and a whole area of a high voltage device may be decreased.

Please note that in the present embodiment, the first conductivity type is n type, and the second conductivity type is p type, and in another embodiment, the first conductivity type may be p type, and the second conductivity type may be n type.

Please refer to FIG. 6 which shows specific steps of the making process including:

providing a substrate of the first conductivity type 201;

forming an epitaxial layer of the first conductivity type 202 on the substrate of the first conductivity type 201, the epitaxial layer of the first conductivity type 202 comprising the cell region A and the termination region B, and the termination region B being surrounding the periphery of the cell region A;

forming a trench gate structure in the epitaxial layer of the first conductivity type 202, the trench gate structure comprising a gate oxide layer 2081 and a gate conductive layer 209;

forming a well mask;

through the well mask, forming the floating islands of the second conductivity type with implanting the dopant of the second conductivity type in the epitaxial layer of the first conductivity type 202, the floating islands of the second conductivity type being positioned in the epitaxial layer of the first conductivity type 202, and a top surface and a bottom surface of the floating islands of the second conductivity type being in mutual contact with the epitaxial layer of the first conductivity type 202, wherein the floating islands of the second conductivity type comprise the floating islands of the second conductivity type of the cell region 2061 and the floating islands of the second conductivity type of the termination region 2062;

through the well mask, forming the pillars of the second conductivity type with implanting the dopant of the second conductivity type in the epitaxial layer of the first conductivity type 202, the pillars of the second conductivity type being positioned in the epitaxial layer of the first conductivity type 202 and right above the floating islands of the second conductivity type, wherein the pillars of the second conductivity type comprise the pillars of the second conductivity type of the cell region 2071 and the pillars of the second conductivity type of the terminal region 2072.

through the well mask, forming wells of the second conductivity type in the epitaxial layer of the first conductivity type 202, the wells of the second conductivity type being in mutual contact with the pillars of the second conductivity type, and comprising a well of the second conductivity type of the cell region 2031 and a well of the second conductivity type of the termination region 2032;

through a source mask, forming a source of the first conductivity type of the cell region 2041 in the well of the second conductivity type of the cell region 2031;

through a contact mask, forming contact structures comprising a contact structure of the cell region 2051 and a contact structure of the termination region 2052, the contact structure of the cell region 2051 being passing through the source of the first conductivity type of the cell region 2041 and in mutual contact with the well of the second conductivity type of the cell region 2031, and the contact structure of the termination region 2052 being in mutual contact with the well of the second conductivity type of the termination region 2032.

Specifically, through the trench gate structure of the cell region, unit area of the power device may be reduced. The process to form the trench gate structure of the cell region and the structure of the trench gate structure of the cell region may not be limited to what is disclosed here, for example, it may be varied in structure to a split gate. The order to form the floating islands of the second conductivity type, the pillars of the second conductivity type and the wells of the second conductivity type through the well mask may not be limited to the present embodiment. The order may be varied depending on the actual needs, for example, the floating islands of the second conductivity type and the pillars of the second conductivity type may be formed after forming the well of the second conductivity type through implanting with the well mask. Please refer to the first embodiment for the detailed function of the floating islands of the second conductivity type and the pillars of the second conductivity type.

For example, a thickness range of the epitaxial layer of the first conductivity type 202 between the formed floating islands of the formed second conductivity type and the pillars of the second conductivity type is greater than 0.1 μm, such as 1 μm, 5 μm, but not limited to these values.

For example, when forming the source of the first conductivity type of the cell region 2041, one more step of forming the source of the first conductivity type of the termination region 2042 in the well of the first conductivity type of the termination region 2032 through the source mask may be performed.

Specifically, as shown in FIG. 7, in the present embodiment, the contact structures are formed with implanting the dopant of the second conductivity type in the wells of the second conductivity type to form the short-circuit connection to the sources of the first conductivity type that further reduces the on-state resistance. The contact structures comprise the contact structure of the cell region 2051 and the contact structure of the termination region 2052. The contact structure of the cell region 2051 is passing through the source of the first conductivity type of the cell region 2041 and in mutual contact with the well of the second conductivity type of the cell region 2031. The contact structure of the termination region 2052 is passing through the source of the first conductivity type of the termination region 2042 and in mutual contact with the well of the second conductivity type of the termination region 2032.

Then, more steps of forming a source metal layer and a drain metal layer may be comprised to form a VDMOSFET device. The steps to form the super junction power device may be varied depending on the needs. Further, the structure of the gate may be a trench gate or a split gate to further to raise the withstand voltage in the termination region, reduce the area thereof and decrease the whole area of the high voltage device.

For example, one more step of forming a field plate 210 and a field limiting ring in the termination region B may be performed.

Specifically, referring to FIG. 8, in the present embodiment, the termination region B comprises the field plate 210. The field plate 210 may be but not limited to biasing field plate. The termination region B may comprise other structure(s) such as a floating field plate, the field limiting ring, etc. to raise the breakdown voltage in the termination region B and reduce the width thereof.

For example, one more step of forming a buffer layer of the first conductivity type at the bottom surface of the epitaxial layer of the first conductivity type 202 may be comprised.

For example, one more step of forming a buffer layer of the first conductivity type at the bottom surface of the epitaxial layer of the first conductivity type 202 may be comprised.

Please refer to FIG. 9. The present embodiment also provides a method of making an IGBT device. The difference between the method of making a VDMOSFET device in FIG. 8 and the method of FIG. 9 is an additional implanted layer of the second conductivity type 220. Specifically, the substrate of the first conductivity type 201 may be removed with backside grinding or CMP and the implanted layer of the second conductivity type 220 may be formed with but not limited to implanting the dopant of the second conductivity type.

Please refer to FIG. 7. The present embodiment also provides a super junction power device, which may be made with but not limited to one of the aforesaid methods.

Specifically, the super junction power device may comprise the epitaxial layer of the first conductivity type 202, the trench gate structure of the cell region, the wells of the second conductivity type, the sources of the first conductivity type, the contact structures, the floating islands of the second conductivity type and the pillars of the second conductivity type, in which the epitaxial layer of the first conductivity type 202 comprise the cell region A and the termination region B surrounding the periphery of the cell region A. The wells of the second conductivity type are positioned in the epitaxial layer of the first conductivity type 202. The wells of the second conductivity type comprise the well of the second conductivity type of the cell region 2031 and the well of the second conductivity type of the termination region 2032. The source of the first conductivity type of the cell region 2041 is positioned in the well of the second conductivity type of the cell region 2031. The trench gate structure of the cell region is positioned in the epitaxial layer of the first conductivity type 202. The trench gate structure of the cell region comprises a gate oxide layer 2081 and a gate conductive layer 209. The trench gate structure of the cell region is passing through the source of the first conductivity type of the cell region 2041 and the well of the second conductivity type of the cell region 2031. The contact structures comprise the contact structure of the cell region 2051 and the contact structure of the termination region 2052. The contact structure of the cell region 2051 is passing through the source of the first conductivity type of the cell region 2041 and in mutual contact with the well of the second conductivity type of the cell region 2031. The contact structure of the termination region 2052 is in mutual contact with the well of the second conductivity type of the termination region 2032. The floating islands of the second conductivity type are positioned in the epitaxial layer of the first conductivity type 202 and the top surface and the bottom surface of the floating islands of the second conductivity type are in mutual contact with the epitaxial layer of the first conductivity type 202. The floating islands of the second conductivity type comprise the floating island of the second conductivity type of the cell region 2061 and the floating island of the second conductivity type of the termination region 2062. The pillars of the second conductivity type are positioned in the epitaxial layer of the first conductivity type 202 and right above the floating islands of the second conductivity type and in mutual contact with the wells of the second conductivity type. The pillars of the second conductivity type comprise the pillar of the second conductivity type of the cell region 2071 and the pillar of the second conductivity type of the termination region 2072.

For example, the floating island of the second conductivity type of the cell region 2061 has the same width as that of the pillar of the second conductivity type of the cell region 2071, and the floating island of the second conductivity type of the termination region 2062 has the same width as that of the pillar of the second conductivity type of the termination region 2072 and that of the well of the second conductivity type of the termination region 2032. The depth of pillars 2071 and 2072 of the second conductivity is preferred to be no deeper than the bottom of trench gate structure For example, a thickness range of the epitaxial layer of the first conductivity type 202 between the floating islands of the second conductivity type and the pillars of the second conductivity type is greater than 0.1 µm, such as 1 µm, 5 µm, but not limited to these values.

For example, the source of the first conductivity type of the termination region 2042 may be further comprised. The source of the first conductivity type of the termination region 2042 is positioned in the well of the second conductivity type of the termination region 2032, and passing through the contact structure of the termination region 2052.

For example, one more step of forming the termination region B comprising the field plate 210 and the field limiting ring may be performed.

Specifically, referring to FIG. 8, in the present embodiment, the termination region B comprises the field plate 210. The field plate 210 may be but not limited to biasing field plate. The termination region B may comprise other structure(s) such as a floating field plate, the field limiting ring, etc. to raise the withstand voltage in the termination region, reduce the area thereof and decrease the whole area of the high voltage device.

For example, an implanted layer of the second conductivity type 220 may be formed at the bottom surface of the epitaxial layer of the first conductivity type 202.

For example, an implanted layer of the second conductivity type may be formed at the bottom surface of the epitaxial layer of the first conductivity type 202.

Specifically, the VDMOSFET may be formed further with the source metal layer and the drain metal layer. Please refer to FIG. 9, which shows that an additional implanted layer of the second conductivity type 213 may be added to form the IGBT device. Further, the structure of the gate may not be limited to planar type, but also trench type or split gate.

Third Embodiment

Figure 10:
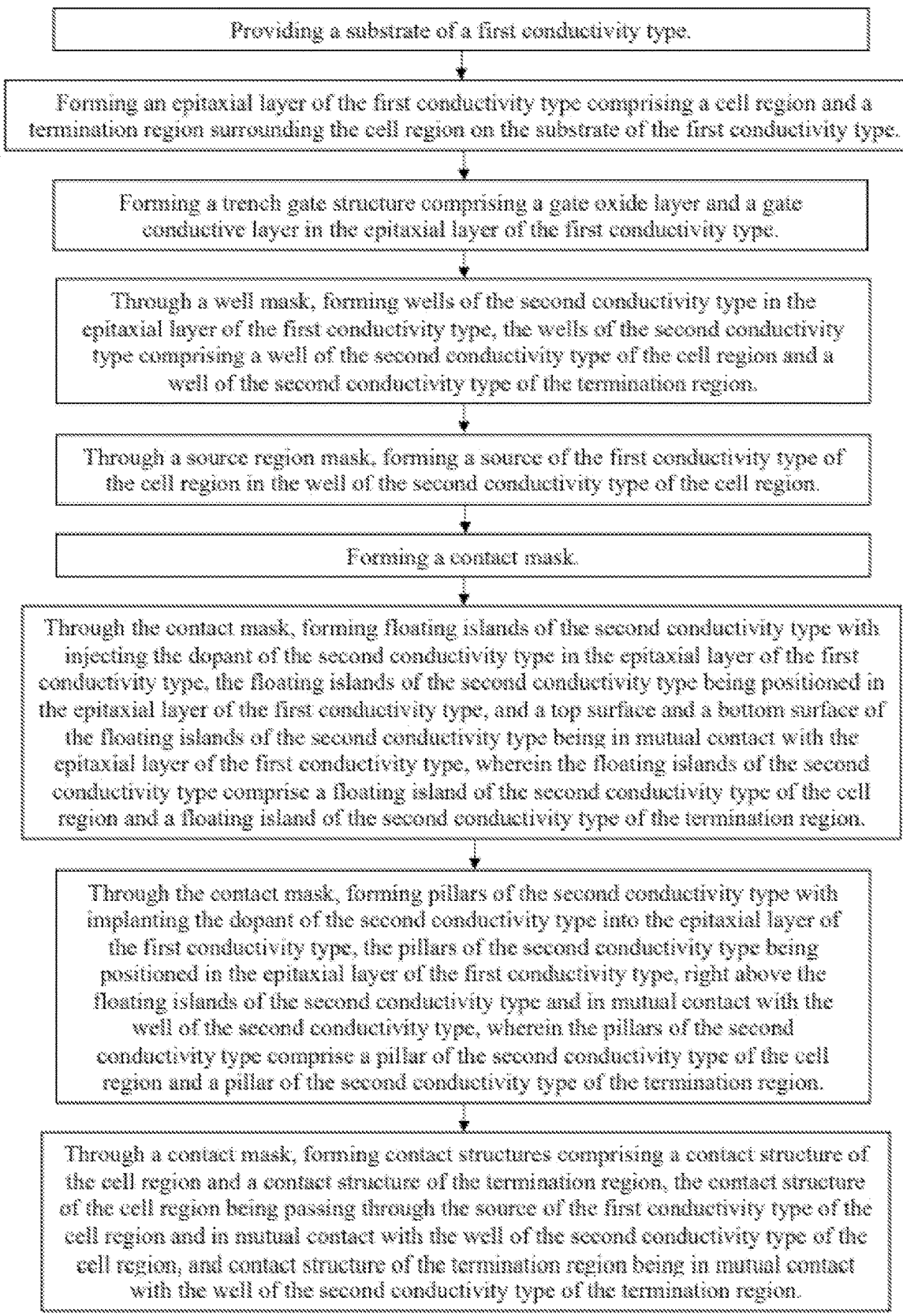
FIG. 10 shows a process flow chart of forming a super junction power device according to a third embodiment.

Please refer to FIG. 10. The present embodiment also provides a method of making yet another super junction power device, which has both a floating island of a second conductivity type and a pillar of the second conductivity type. FIGS. 10-13 show perspective views of a structure of the super junction power device. The difference between the first and second embodiments and the present embodiment is that, in the present embodiment, dopant of the second conductivity type may be implanted into an epitaxial layer of a first conductivity type directly through a contact mask before or after forming contact structures to form a floating island of the second conductivity type of a cell region and a pillar of the second conductivity type of the cell region which has the same width as that of a contact structure of the cell region and a floating island of the second conductivity type of a termination region and a pillar of the second conductivity type of the termination region which has the same width as that of a contact structure of the termination region successively. The contact structures may be trench gate structure and in such a case, the contact structures comprise a contact of the second conductivity type and a metal contact. The buffer layer of the first conductivity type is formed at a bottom surface of the epitaxial layer of the first conductivity type.

In the present embodiment, the dopant of the second conductivity type may be implanted directly to the epitaxial layer of the first conductivity type to sequentially form the floating island of the second conductivity type of the cell region and the pillar of the second conductivity type of the cell region in the cell region, both of which have the same width, and the floating island of the second conductivity type of the termination region and the pillar of the second conductivity type of the termination region in the termination region, both of which have the same width. No additional mask is needed either. Therefore, the formation process is simple, the cost is low and yield and reliability are high. Further, a withstand voltage in the termination region may be raised, an area thereof may be reduced, and a whole area of a high voltage device may be decreased. Preferably, the floating islands of the second conductivity type and the pillars of the second conductivity type may be formed after forming the contact mask and forming the contact structure to perform an anneal process for the floating island of the second conductivity type and the pillar of the second conductivity type simultaneously when performing an anneal step for the contact structure. As such, the complexity of process may be declined and the cost may be reduced.

Please note that in the present embodiment, the first conductivity type is n type, and the second conductivity type is p type, and in another embodiment, the first conductivity type may be p type, and the second conductivity type may be n type.

Please refer to FIG. 10 which shows specific steps of the making process including:

providing a substrate of the first conductivity type 301;

forming an epitaxial layer of the first conductivity type 302 on the substrate of the first conductivity type 301, the epitaxial layer of the first conductivity type 302 comprising the cell region A and the termination region B, and the termination region B being surrounding the periphery of the cell region A;

forming a trench gate structure of the cell region in the epitaxial layer of the first conductivity type 302, the trench gate structure of the cell region comprising a gate oxide layer 3081 and a gate conductive layer 309;

through a well mask, forming wells of the second conductivity type in the epitaxial layer of the first conductivity type 302 comprising a well of the second conductivity type of the cell region 3031 and a well of the second conductivity type of the termination region 3032;

through a source mask, forming a source of the first conductivity type of the cell region 3041 in the well of the second conductivity type of the cell region 3031;

forming the contact mask;

through the contact mask, forming floating islands of the second conductivity type with implanting the dopant of the second conductivity type in the epitaxial layer of the first conductivity type 302, the floating islands of the second conductivity type being positioned in the epitaxial layer of the first conductivity type 302, and a top surface and a bottom surface of the floating islands of the second conductivity type being in mutual contact with the epitaxial layer of the first conductivity type 302, wherein the floating islands of the second conductivity type comprise the floating islands of the second conductivity type of the cell region 3061 and the floating islands of the second conductivity type of the termination region 3062;

through the contact mask, forming the pillars of the second conductivity type with implanting the dopant of the second conductivity type in the epitaxial layer of the first conductivity type 302, the pillars of the second conductivity type being positioned in the epitaxial layer of the first conductivity type 302, right above the floating island of the second conductivity type and in mutual contact with the wells of the second conductivity type, wherein the pillars of the second conductivity type comprise the pillars of the second conductivity type of the cell region 3071 and the pillars of the second conductivity type of the terminal region 3072;

through the contact mask, forming contact structures comprising a contact structure of the cell region 3051 and a contact structure of the termination region 3052, the contact structure of the cell region 3051 being passing through the source of the first conductivity type of the cell region 3041 and in mutual contact with the well of the second conductivity type of the cell region 3031, and the contact structure of the termination region 3052 being in mutual contact with the well of the second conductivity type of the termination region 3032.

Specifically, through the trench gate structure, unit area of the power device may be reduced. The process to form the trench gate structure of the cell region and the structure of the trench gate structure of the cell region may not be limited to what is disclosed here, for example, it may be varied in structure to a split gate.

For example, a thickness range of the epitaxial layer of the first conductivity type 302 between the formed floating islands of the formed second conductivity type and the pillars of the second conductivity type is greater than 0.1 μm, such as 1 μm, 5 μm, but not limited to these values.

For example, when forming the source of the first conductivity type of the cell region 3041, one more step of forming the source of the first conductivity type of the termination region 3042 in the well of the first conductivity type of the termination region 3032 through the source mask may be performed.

Specifically, steps of forming the contact structures may comprise:

through the contact mask, forming the trench gate structure of the cell region passing through the source of the first conductivity type of the cell region with etching the source of the first conductivity type of the cell region 3041, and forming the trench gate structure of the termination region passing through the source of the first conductivity type of the termination region with etching the source of the first conductivity type of the termination region 3042; through the contact mask, forming the contact of the second conductivity type of the cell region 3051a and the contact of the second conductivity type of the termination region 3052a with implanting of the dopant of the second conductivity type;

through the contact mask, forming the metal contact 3051b filling in the trench gate structure of the cell region and the metal contact 3052b filling in the trench gate structure of the termination region, and the metal contacts 3051b, 3052b being in mutual contact with the contact of the second conductivity type of the cell region 3051a and the contact of the second conductivity type of the termination region 3052a.

Specifically, the pillars of the second conductivity type are in mutual contact with the contact of the second conductivity type of the cell region 3051a and the contact of the second conductivity type of the termination region 3052a, and the metal contacts 3051b, 3052b may be made from metal W to form a short-circuit connection to the sources of the first conductivity type to further decrease the on-state resistance and reduce area for a conventional planar contact structure. Preferably, the floating islands of the second conductivity type and the pillars of the second conductivity type may be formed after forming the contact mask and forming the contact structures, so as to perform an anneal process for the floating islands of the second conductivity type and the pillars of the second conductivity type simultaneously when performing an anneal step for the contact of the second conductivity type. As such, the complexity of process may be declined and the cost may be reduced. The order to form the floating islands of the second conductivity type, the pillars of the second conductivity type and the contact structures through the contact mask may not be limited to the present embodiment. The order may be varied depending on the actual needs. Please refer to the first embodiment for the detailed function of the floating islands of the second conductivity type and the pillars of the second conductivity type.

Then, more steps of forming a source metal layer and a drain metal layer may be comprised to form a VDMOSFET device, in which the order to perform the steps of forming the super junction power device may be not limited but depend on the actual needs. Further, the structure of the gate may not be limited to planar type, but also trench type or split gate.

For example, one more step of forming a field plate 310 and a field limiting ring in the termination region B may be performed.

Figure 12:
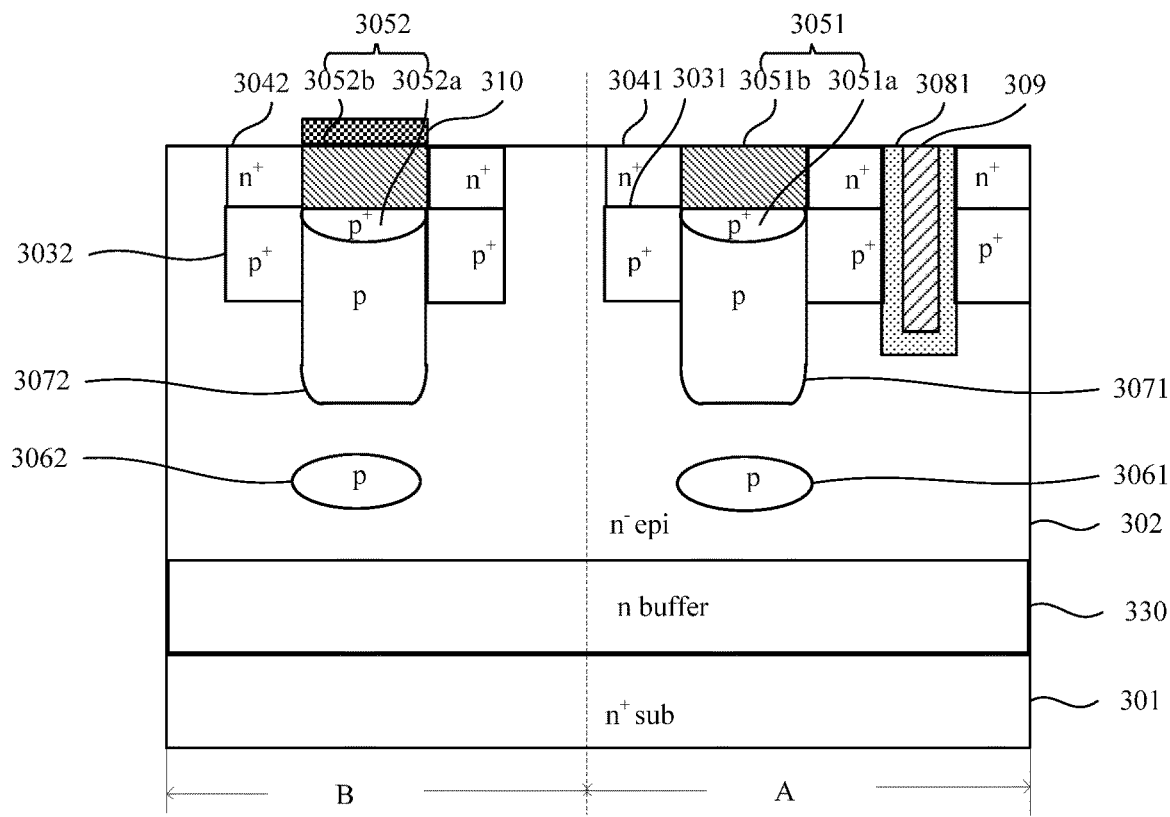
FIG. 12 shows a perspective view of a structure of a super junction VDMOSFET device according to the third embodiment.

Specifically, referring to FIG. 12, in the present embodiment, the termination region B comprises the field plate 310. The field plate 310 may be but not limited to biasing field plate. The termination region B may comprise other structure(s) such as a floating field plate, the field limiting ring, etc. to raise the withstand voltage in the termination region, reduce the area thereof and decrease the whole area of the high voltage device.

For example, one more step of forming a buffer layer of the first conductivity type 330 at the bottom surface of the epitaxial layer of the first conductivity type 302 may be comprised.

Specifically, through the buffer layer of the first conductivity type 330, the dopant atoms of the substrate of the first conductivity type 301 may be prevented from diffusion into the epitaxial layer of the first conductivity type 302 in a high temperature process; therefore, breakdown voltage of the super junction power device is not degraded by the redistribution of doping concentration of the epitaxial layer. The problem of tail current during device switching off may also be solved with the buffer layer of the first conductivity type 330.

Figure 13:
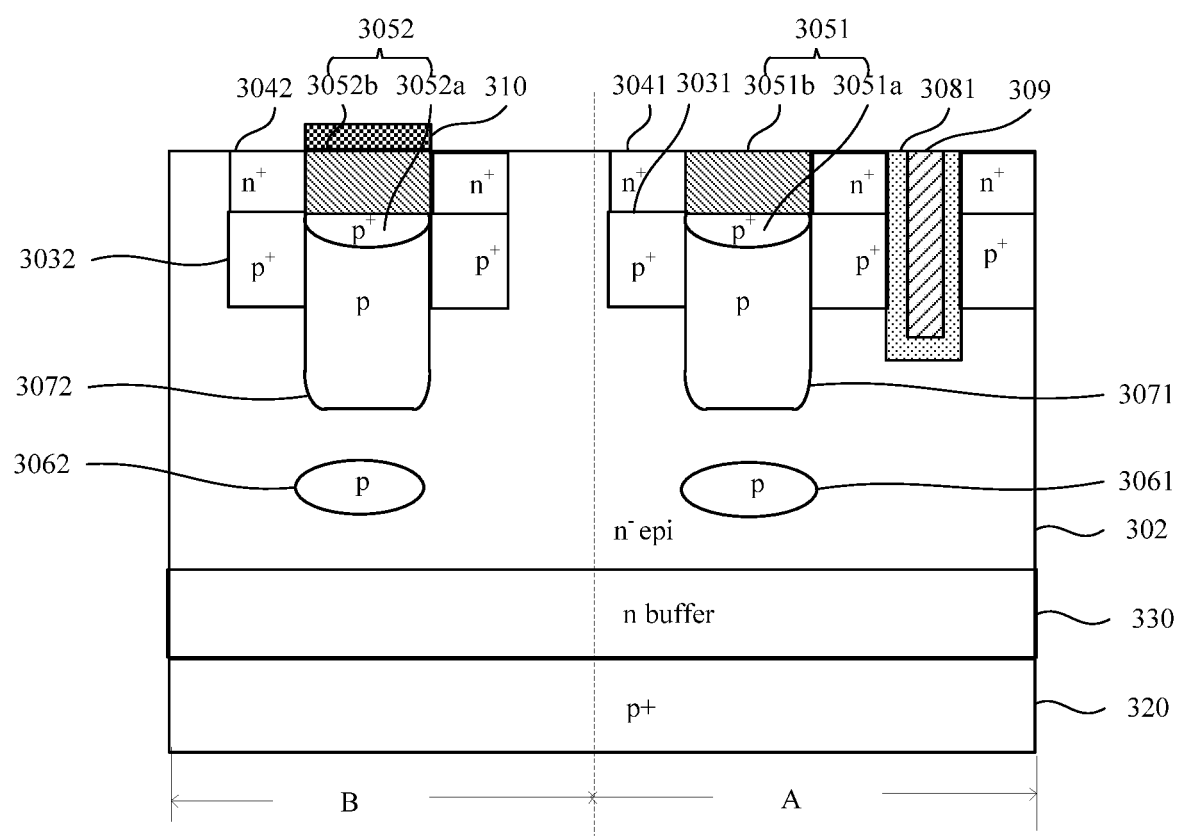
FIG. 13 shows a perspective view of a structure of a super junction IGBT device according to the third embodiment.

Please refer to FIG. 13. The present embodiment also provides a method of making an IGBT device. The difference between the method of making a VDMOSFET device in FIG. 12 and the method of FIG. 13 is an additional step of making an additional implanted layer of the second conductivity type 320. Specifically, the substrate of the first conductivity type 301 may be removed by backside grinding or CMP and the implanted layer of the second conductivity type 320 may be formed with but not limited to implanting the dopant of the second conductivity type.

Figure 11:
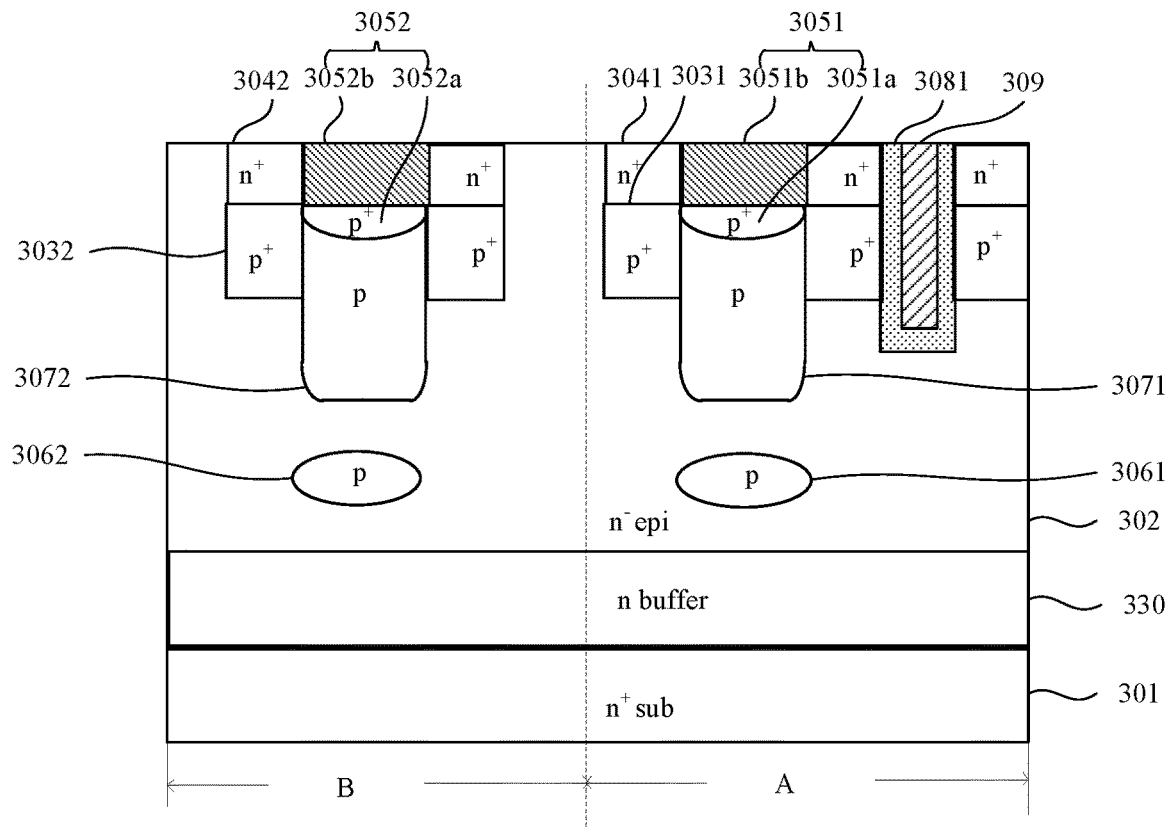
FIG. 11 shows a perspective view of a structure of a super junction power device according to the third embodiment.

Please refer to FIG. 11. The present embodiment also provides a super junction power device, which may be made with but not limited to one of the aforesaid methods.

Specifically, the super junction power device may comprise the epitaxial layer of the first conductivity type 302, the trench gate structure of the cell region, the wells of the second conductivity type, the sources of the first conductivity type, the contact structures, the floating islands of the second conductivity type and the pillars of the second conductivity type, in which the epitaxial layer of the first conductivity type 302 comprise the cell region A and the termination region B surrounding the periphery of the cell region A. The wells of the second conductivity type are positioned in the epitaxial layer of the first conductivity type 302. The wells of the second conductivity type comprise the well of the second conductivity type of the cell region 3031 and the well of the second conductivity type of the termination region 3032. The source of the first conductivity type of the cell region 3041 is positioned in the well of the second conductivity type of the cell region 3031. The trench gate structure of the cell region is positioned in the epitaxial layer of the first conductivity type 302, comprising a gate oxide layer 3081 and a gate conductive layer 309, and passing through the source of the first conductivity type of the cell region 3041 and the well of the second conductivity type of the cell region 3031. The contact structures comprise the contact structure of the cell region 3051 and the contact structure of the termination region 3052. The contact structure of the cell region 3051 is passing through the source of the first conductivity type of the cell region 3041 and in mutual contact with the well of the second conductivity type of the cell region 3031. The contact structure of the termination region 3052 is in mutual contact with the well of the second conductivity type of the termination region 3032. The floating islands of the second conductivity type are positioned in the epitaxial layer of the first conductivity type 302 and the top surface and the bottom surface of the floating islands of the second conductivity type are in mutual contact with the epitaxial layer of the first conductivity type 302. The floating islands of the second conductivity type comprise the floating island of the second conductivity type of the cell region 3061 and the floating island of the second conductivity type of the termination region 3062. The pillars of the second conductivity type are positioned in the epitaxial layer of the first conductivity type 302 and right above the floating islands of the second conductivity type and in mutual contact with the wells of the second conductivity type. The pillars of the second conductivity type comprise the pillar of the second conductivity type of the cell region 3071 and the pillar of the second conductivity type of the termination region 3072.

For example, the floating island of the second conductivity type of the cell region 3061 has the same width as that of the pillar of the second conductivity type of the cell region 3071 and that of the contact structure of the cell region 3051, and the floating island of the second conductivity type of the termination region 3062 has the same width as that of the pillar of the second conductivity type of the termination region 3072 and that of the contact structure of the termination region 3052.

For example, a thickness range of the epitaxial layer of the first conductivity type 302 between the floating islands of the second conductivity type and the pillars of the second conductivity type is greater than 0.1 μm, such as 1 μm, 5 μm, but not limited to these values.

For example, the source of the first conductivity type of the termination region 3042 may be further comprised. The source of the first conductivity type of the termination region 3042 is positioned in the well of the second conductivity type of the termination region 3032, and passing through the contact structure of the termination region 3052.

For example, the contact structure of the cell region 3051 may comprise the contact of the second conductivity type 3051a and the metal contact 3051b, and the contact structure of the termination region 3052 may comprise the contact of the second conductivity type 3052a and the metal contact 3052b.

For example, one more step of forming the termination region B comprising the field plate 210 and the field limiting ring may be performed.

Specifically, referring to FIG. 12, in the present embodiment, the termination region B comprises the field plate 310. The field plate 310 may be but not limited to biasing field plate. The termination region B may comprise other structure(s) such as a floating field plate, the field limiting ring, etc. to raise the withstand voltage in the termination region, reduce the area thereof and decrease the whole area of the high voltage device.

For example, a buffer layer of the first conductivity type 330 may be formed at the bottom surface of the epitaxial layer of the first conductivity type 302.

For example, an implanted layer of the second conductivity type 320 may be formed at the bottom surface of the epitaxial layer of the first conductivity type 302.

Specifically, the VDMOSFET may be formed further with the source metal layer and the drain metal layer. Please refer to FIG. 13, which shows that an additional implanted layer of the second conductivity type 313 may be added to form the IGBT device. Further, the structure of the gate may not be limited to planar type, but also trench type or split gate.

To sum up, according to the super junction power device and the method of making the same of the present invention, when making a super junction power device, dopant of the second conductivity type may be implanted into the epitaxial layer of the first conductivity type to form the floating islands of the second conductivity type and the pillars of the second conductivity type successively through adding a super junction mask after forming the epitaxial layer of the first conductivity type, directly through the well mask before or after forming the wells of the second conductivity type, and directly through the contact mask before or after forming the contact structures. The floating islands of the second conductivity type comprise the floating island of the second conductivity type of the cell region and the floating island of the second conductivity type of the termination region. The pillars of the second conductivity type comprise the pillar of the second conductivity type of the cell region and the pillar of the second conductivity type of the termination region. Therefore, the formation process is simple, the cost is low and yield and reliability are high. Through the floating island of the second conductivity type of the cell region and the pillar of the second conductivity type of the cell region, in open state (off state), both the floating island of the second conductivity type and the pillar of the second conductivity type may facilitate charge sharing effect of the drift region of the epitaxial layer of the first conductivity type, so as to raise the breakdown voltage and decrease both Miller capacitance and input capacitance; and in on state, both the floating island of the second conductivity type of the cell region and the pillar of the second conductivity type of the cell region allow the drift region of the epitaxial layer of the first conductivity type having higher doping concentration to significantly increasing current conduction and decrease an on-state resistance of a VDMOSFET device, so as to form an additional parasitic bipolar transistor in the epitaxial layer of the first conductivity type to further decrease the on-state resistance of a IGBT device. Meanwhile, both the floating islands of the second conductivity type of the termination region and the pillars of the second conductivity type of the termination region can be served as a voltage divider to raise the efficiency of the termination voltage withstand structure and reduce required area of the termination to decrease the whole area of the high voltage device.

It is to be understood that these embodiments are not meant as limitations of the invention but merely exemplary descriptions of the invention with regard to certain specific embodiments. Indeed, different adaptations may be apparent to those skilled in the art without departing from the scope of the annexed claims. In all instances, the scope of such claims shall be considered on their own merits in light of this disclosure, and such claims accordingly define the invention(s), and their equivalents or variations, that are protected thereby.

What is claimed is:

1. A method of making a super junction power device, characterized by, comprising:

forming an epitaxial layer of a first conductivity type, comprising a cell region and a termination region surrounding the cell region;

forming a trench gate structure of the cell region in the epitaxial layer of the first conductivity type, the trench gate structure comprising a gate oxide layer and a gate conductive layer;

through a well mask, in the epitaxial layer of the first conductivity type, forming a plurality of wells of a second conductivity type comprising a well of the second conductivity type of the cell region and a well of the second conductivity type of the termination region, and before or after forming the wells of the second conductivity type, directly through the well mask, implanting dopant of the second conductivity type into the epitaxial layer of the first conductivity type to form a plurality of floating islands of the second conductivity type and a plurality of pillars of the second conductivity type successively, wherein:

the plurality of floating islands of the second conductivity type, positioning in the epitaxial layer of the first conductivity type, are formed, thereby top surfaces and bottom surfaces of the floating islands of the second conductivity type are in mutual contact with the epitaxial layer of the first conductivity type, and the floating islands of the second conductivity type comprise a floating island of the second conductivity type of the cell region and a floating island of the second conductivity type of the termination region, and the plurality of pillars of the second conductivity type, positioning in the epitaxial layer of the first conductivity type and right above the floating islands of the second conductivity type, are formed, thereby the pillars of the second conductivity type are in mutual contact with the well of the second conductivity type, and the pillars of the second conductivity type comprise a pillar of the second conductivity type of the cell region and a pillar of the second conductivity type of the termination region; and the floating islands of the second conductivity type and the pillars of the second conductivity type have the same width as that of the wells of the second conductivity type;

through a source mask, in the well of the second conductivity type of the cell region, forming a source of the first conductivity type of the cell region; and through a contact mask, forming a plurality of contact structures comprising a contact structure in the cell region and a contact structure in the termination region, the contact structure in the cell region passing through the source of the first conductivity type of the cell region and in mutual contact with the well of the second conductivity type of the cell region, and the contact structure in the termination region being in mutual contact with the well of the second conductivity type of the termination region.

2. The method of making a super junction power device according to claim 1, characterized by: wherein a thickness range of the epitaxial layer of the first conductivity type between the formed floating island of the formed second conductivity type and the pillar of the second conductivity type is greater than 0.1 µm.

3. The method of making a super junction power device according to claim 1, characterized by: wherein the first conductivity type is n type, and the second conductivity type is p type; or the first conductivity type is p type, and the second conductivity type is n type.

4. The method of making a super junction power device according to the method of claim 1, characterized by: further comprising: through the source mask, in the well of the second conductivity type of the termination region, forming a source of the first conductivity type of the termination region, and the contact structure in the termination region passing through the source of the first conductivity type of the termination region.

5. The method of making a super junction power device according to claim 4, characterized by: the step of forming the contact structures comprising:

through the contact mask, forming a contact trench of the cell region passing through the source of the first conductivity type of the cell region and a contact trench of the termination region passing through the source of the first conductivity type of the termination region;

through the contact mask, forming a contact of the second conductivity type of the cell region and a contact of the second conductivity type of the termination region;

through the contact mask, forming a metal contact of the cell region filling in the contact trench of the cell region and a metal contact of the termination region filling in the contact trench of the termination region.

6. The method of making a super junction power device according to claim 1, characterized by: further comprising at least one step of forming a field plate and a field limiting ring in the termination region.

7. The method of making a super junction power device according to claim 1, characterized by: further comprising a step of forming a buffer layer of the first conductivity type at the bottom surface of the epitaxial layer of the first conductivity type.

8. The method of making a super junction power device according to claim 1, characterized by: further comprising a step of forming an implanted layer of the second conductivity type at the bottom surface of the epitaxial layer of the first conductivity type.

* * * * *